US005139611A

United States Patent [19]

Pusey et al.

[11] Patent Number: 5,139,611

[45] Date of Patent: Aug. 18, 1992

[54] COLLOIDAL SPHERES IN SUSPENSION

[75] Inventors: Peter N. Pusey, Worcestershire, England; Bruce Ackerson, Stillwater, Okla.

[73] Assignee: The Secretary of State for Defence in Her Britannic Majesty's Government of the United Kingdom of Great Britain and Northern Ireland, London, England

[21] Appl. No.: 623,745

[22] PCT Filed: May 17, 1989

[86] PCT No.: PCT/GB89/00532

§ 371 Date: Dec. 18, 1990

§ 102(e) Date: Dec. 18, 1990

[87] PCT Pub. No.: WO89/11555

PCT Pub. Date: Nov. 30, 1989

[30] Foreign Application Priority Data

May 19, 1988 [GB] United Kingdom ................. 8811894

[51] Int. Cl.[5] ................................................ C30B 7/00

[52] U.S. Cl. .................................... 156/621; 156/600; 156/622; 156/DIG. 93; 156/DIG. 100; 422/245

[58] Field of Search ....... 156/600, 621, 622, DIG. 93, 156/DIG. 108; 422/245

[56] References Cited

U.S. PATENT DOCUMENTS 3,244,488 4/1966 Linares et al. ...................... 156/621
3,458,249 11/1969 George ................................ 350/160
4,099,854 4/1978 Decker et al. ....................... 350/312
4,376,755 3/1983 Narayan et al. .................... 156/605

FOREIGN PATENT DOCUMENTS

A0168988 6/1986 European Pat. Off. .

OTHER PUBLICATIONS

"The Growth of Single Crystals of $Rb_2PtCl_6$ and Similar Alkali Precious Metal Chlorides and of $Ba_2SO_4$ An Ion-Exchanged Sodium-Free Silica Gel", *Journal of Crystal Growth* 23 (1974) pp. 228-232.

Flaugh et al., Applied Spectroscopy, vol. 38, No. 6, pp. 847-850, 1984.

Ackerson et al., Physical Review A, vol. 30, No. 2, pp. 906-918, 1984.

Clark et al., Nature, vol. 281, pp. 57-60, Sep. 6, 1979.

Calvert, Nature, vol. 317, p. 201, Sep. 19, 1985.

Pusey et al., Nature, vol. 320, pp. 340-342, Mar. 27, 1986.

*Primary Examiner*—Robert Kunemund
*Assistant Examiner*—Felisa Garrett
*Attorney, Agent, or Firm*—Nixon & Vanderhye

[57] ABSTRACT

The invention is a method of producing oriented, essentially perfect colloidal crystals by subjecting a suspension of colloidal spheres, which is contained betwen two narrowly spaced substantially parallel surfaces, to oscillating motion. This motion must have a frequency greater than the Brownian motion of the spheres and an amplitude approximately equal to the thickness of the surface's separation. This method is suitable for monosized spheres of radii between about 0.1 and 1 micron. The suspension of colloidal spheres must have a volume fraction greater than 0.49. This method produces colloidal crystals with a uniform face centered cubic structure, which are suitable for use as notch optical filters, high strength ceramics, or thin film dielectric materials.

30 Claims, 2 Drawing Sheets

Fig.1.
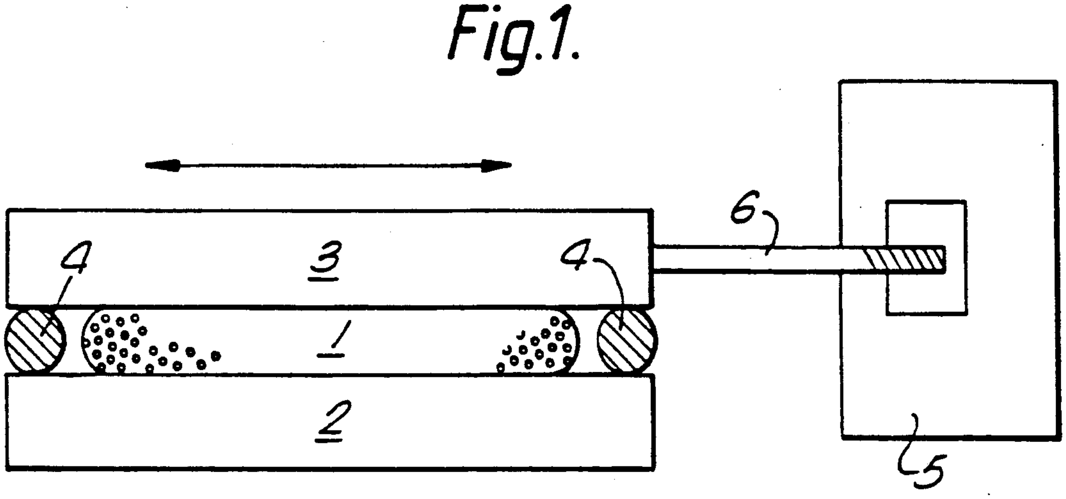
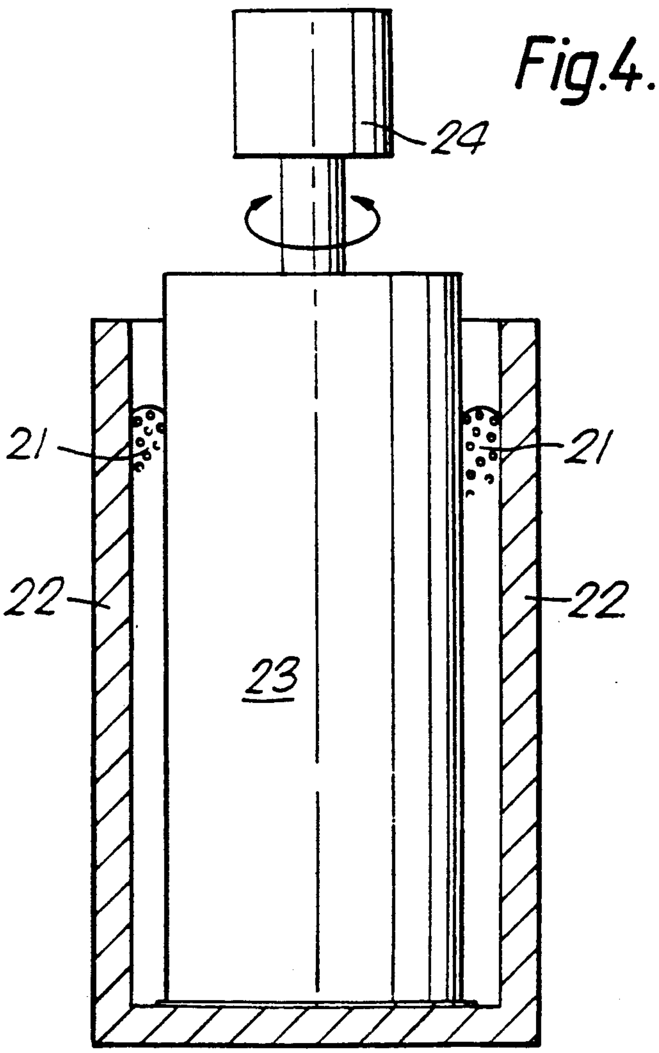
Fig.4.

COLLOIDAL SPHERES IN SUSPENSION

This invention relates to colloidal spheres in suspension, more particularly to a method of growing oriented colloidal crystals and devices produced thereby.

Colloidal spheres are uniformly sized and perfectly round particles, and are usually made out of materials such as polymers or ceramics. They can be made as hard or soft, solid or porous spheres. Colloidal spheres can be manufactured using methods such as emulsion polymerisation or that of using small seed particles made to grow uniformly. The spheres can pack to form a spatial array, termed a colloidal crystal, although this spatial array does not have long term order. A colloidal crystal can exist in free air or with the inter-sphere space filled with liquid such as that which is used as a suspension liquid.

Suspensions of monosized sphereical colloidal particles in a liquid show a range of phase behaviour as the particle concentration is increased (P N Pusey and W van Megen Nature 320 no. 6060 p340 1986). If spheres whose interaction is steep and repulsive i.e. essentially hard sphere, are considered, then concentration of these spheres is expressed as volume fraction 0, the fraction of the total volume of the suspension which is occupied by the particles.

For $\phi \leqq 0.49$ the equilibrium state of the particles in suspension is fluid-like:- the particles are able to diffuse, in Brownian motion, throughout the suspension. For $\phi \geqq 0.55$ the equilibrium state is crystalline:- the particles are located at sites in an ordered spatial array. For $0.49 \leqq \phi \leqq 0.55$ co-existing fluid-like and crystalline phases are found. For $\phi \geqq 0.58$–$0.60$ the equilibrium state is still expected to be crystalline, the high viscosity of the suspension appears to hinder particle diffusion to the point where crystallisation is essentially suppressed and a glassy amorphous solid-like phase is formed.

Two crystallisation mechanisms have been found. The samples are mixed thoroughly and left to sit undisturbed. For $0.49 \leqq \phi \leqq 0.58$ crystallisation is nucleated homogeneously at sites randomly-distributed throughout the sample and small compact crystallites grow with random orientations. For $\phi \leqq 0.58$ (i.e. near the glass transition) crystallisation can be nucleated heterogeneously at the walls of the sample cell and larger irregularly shaped crystallites grow inwards.

Three features of these crystals, formed spontaneously by both mechanisms, make them unsuitable for materials applications:

(i) The crystals contain a large number of stacking faults. Their structure is effectively a random mixture of face centred cubic (f.c.c.) and hexagonal close packed (h.c.p.).

(ii) The orientation of the crystallites is random.

(iii) Inevitably grain boundaries, with imperfect crystalline packing, occupy a significant fraction of the sample.

According to this invention, the above problems are solved by shearing a well mixed suspension of monosized colloidal spheres within a relatively narrow gap between two effectively parallel surfaces. This invention provides a method of growing oriented, essentially perfect, colloidal crystals, and devices produced by this method.

According to this invention a method of growing an oriented, essentially perfect, colloidal crystal comprises the sequential steps of:

(i) preparing a well mixed suspension of monosized colloidal spheres with radii in the range of 0.1 microns to 1.0 microns having a volume fraction, $\phi$, greater than 0.49 in a suitable carrier liquid, (ii) inserting the colloidal suspension in a relatively narrow gap between two effectively parallel surfaces, and (iii) subjecting the surfaces to relative oscillating motion parallel to their surfaces, the relative motion having a frequency greater than that of the Brownian motion of the colloidal spheres and an amplitude approximately equal to that of the gap between the two surfaces.

Typical as supplied monosized colloidal sphere size distributions which are suitable for the invention method are those which are less than 5%.

The preferred minimum volume fraction of colloidal spheres is 0.55.

The relative motion of the plates is preferrably linear.

The two surfaces may be planar or concentrically cylindrical.

Selection of a suitable carrier liquid for suspension may be characterised by the need for a liquid with a refractive index close to, but not exactly equal to that of the particles.

After oscillations sufficient to establish a substantially single crystal structure, suitable sealing means may be applied to retain the carrier liquid in position between the surfaces. Alternatively, prior to sealing, the carrier liquid may be exposed to a gelling reagent so that it forms a stable gel matrix holding the colloid particles in the desired single crystal structure. A third alternative is to let the liquid evaporate, if the colloidal particles can form a self-supporting structure, and then to apply sealing means.

The amplitude of the applied oscillation is crucial for the formation of the colloidal single crystals. The perfect single crystal is obtained when this amplitude is roughly equal to the thickness of the gap between the two surfaces which are being sheared. This corresponds to an applied strain of about one: each particle moves in the shear flow over a distance equal to about one particle diameter relative to its neighbours in adjacent layers. With smaller amplitudes no crystallisation is induced, whereas the structure created with oscillations of greater amplitudes is more complicated.

The frequency $\nu$ of oscillation is also important. The motion imposed by the applied oscillating shear must overcome the natural Brownian motion of the spheres. A Brownian relaxation time $\tau_B$ can be defined by:

$$\tau_B = \eta R^3 (k_B T)^{-1} \quad (1)$$

where $\eta$ is the viscosity of the suspension measured at small shear rates, R is the radius of the particles, $k_B$ is Boltzmann's constant and T is the absolute temperature. The condition for shear induced crystallization is:

$$\nu \tau_B > A \quad (2)$$

where A is a number of order 1.

The number of oscillations typically needed to produce oriented, essentially perfect, colloical crystals is between 100 and 1000. Typical gaps between plates vary between 50–1000 microns.

After growth of suitable colloidal crystals, light that is transmitted through the crystals becomes diffracted and concentrated in a few defined directions. These diffraction patterns show the colloidal spheres to be arranged during the oscillation in a flowing face centred cubic structure with one set of hexagonally packed planes parallel to the surfaces. When the shear is stopped at an appropriate point in the oscillation cycle a single f.c.c. crystal remains.

Typical applications of the oriented, essentially perfect, colloidal crystals are as notch or narrow band optical filters for laser safety goggles and other optical applications, use in the preparation of high strength ceramics with a high packing density, or other technological areas where essentially perfectly stacked ond oriented thin films are required such as for thin film dielectric materials. Where the colloidal crystals are needed for optical applications at least one of the effectively parallel surfaces must be optically transparent.

A notch optical filter may have a number (typically 10 to 1000) layers of hexagonally-packed monosized colloidal spheres, stacked in such a way as to form a perfect crystal.

When such a construction is illuminated perpendicularly with white light, that spectral component which satisfies the Bragg condition for reflection by the layers of spheres will be strongly back-reflected. However light of other wavelengths will pass through the filter relatively unattenuated.

For particle layers spaced by a distance d, the condition for Bragg back-reflection is:

$$2d = \lambda_o n^{-1} \quad (3)$$

where $\lambda_o$ is the wavelength in vacuo of the reflected light and n the refractive index of the colloidal medium, where the colloidal medium is defined as the suspension of colloidal spheres in the carrier liquid. For a close-packed f.c.c. structure the relationship between the sphere radius R and the layer spacing is:

$$d = 2\sqrt{2/3}\ R = 1.633\ R \quad (4)$$

Thus, (3) becomes:

$$R = \lambda_o (3.27\ n)^{-1} \quad (5)$$

For example, a filter blocking light of wavelength 500 nm using colloidal spheres of refractive index 1.5 is obtained by using colloidal spheres of radius 102 nm.

Reflection at angles other than the backward direction can also be effective. For example, with larger spheres of radius R=300 nm (and the refractive index of the carrier liquid is 1.5) light of wavelength λ=490 nm will be diffracted in three beams at approximately 39° away from the (perpendicular) incident direction, thus still providing good filtration of transmitted light. However, this will be accompanied by other reflections: $\lambda_o$=738 nm at an angle of about 70°, $\lambda_o$=735 nm at an angle of about 110° and $\lambda_o$=668 nm at an angle of about 121°.

Nevertheless, the use of larger spheres (R=about 300 nm as opposed to 100 nm for back reflection) could be advantageous for manufacturing processes. For example, it is easier to prepare the larger spheres to have a narrower size distribution which is required for crystallization.

The optimum number N of layers of colloidal spheres in a notch filter is determined by a compromise between two factors, the optical resolution of the filter and its attenuation. The width Δ of the spectral line removed by the filter is approximately defined as:

$$\Delta/\lambda_o \approx N^{-1} \quad (6)$$

Thus 100 layers give a resolution $\lambda_o/\Delta$ of about $10^2$. The filter's attenuation depends largely on the optical inhomogeniety of the colloidal spheres.

Typical colloidal suspension materials for the construction of notch optical filters are charge-stabilized polymer colloidal spheres such as polystyrene in water, sterically-stabilized polymer colloids such as polymethylmethacrylate (PMMA) in an organic carrier liquid or a mixture of organic liquids such as dodecane, decalin, tetralin, cyclohexane or carbon disulphide. Alternatively, colloidal spheres of materials such as silica, titania, alumina, or zirconia can be used as either charge-stabilized in water or sterically-stabilized in an organic liquid or a mixture of organic liquids such as dodecane, decalin, tetralin, cyclohexane or carbon disulphide.

This invention may also be applied to the manufacture of high strength ceramics. Colloidal spheres of ceramic materials such as silica, alumina, zirconia or titania which are charge-stabilized in water or sterically-stabilized in an organic liquid such as dodecane or cyclohexane are prepared in a concentrated suspension. In the current method of fabrication, this material is cast as a green body which is dried and sintered to form a final product. Two requirements for the green body for high strength ceramics are a high overall packing density of spheres, to minimise shrinkage on drying, and the absence of voids (or local regions of low packing density) which could form nuclei of weaknesses in the final sintered material. For the latter reason a polycrystalline green body is unsuitable because of the potentially weakening grain boundaries between crystallites. To avoid this an amorphous or glassy arrangement of spheres is currently preferred. However the maximum volume fraction $\phi$ of compressed monosized spheres is about 0.64 (the random close packed density) whereas crystalline close packing has a significantly higher volume fraction of about 0.74.

To use this invention a suspension or colloidal spheres of the ceramic material at a volume fraction of $\phi \approx 0.6$ is placed in a mould designed so that an oscillatory shear can be applied. After a sufficient number of shearing cycles the spheres are arranged spatially as a perfect f.c.c. crystal which is then be compressed to $\phi \approx 0.74$ before sintering. This process circumvents the difficulties in low overall and local packing densities described above. Ceramic sheets and pipes are produced by applying oscillating shear in a planar or cylindrical geometry respectively.

Specific applications of the invention will now be described by example only, with reference to the accompanying figures:

FIG. 1 is a schematic representation of the apparatus used to orientate essentially perfect colloidal crystals in a planar linear geometry.

FIG. 4 is a schematic cross-section of the apparatus used to orientate essentially perfect colloidal crystals in a cylindrical geometry.

Figure 2:
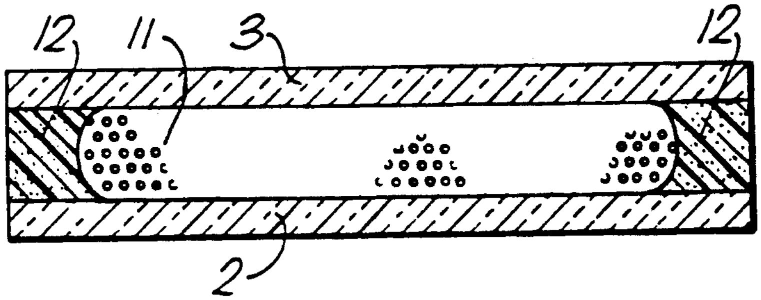
FIG. 2 is a schematic cross-section of a notch optical filter.

As shown in FIG. 1, the invention is embodied by placing a well mixed colloidal suspension 1 between two float glass plates 2 and 3. The colloidal suspension 1 contains colloidal spheres of radius about 100 nm. The glass plates 2 and 3 are about 0.5. mm to 1.0 mm thick. Spacers 4 are used to provide a gap between the two plates and this may be between 50 and 1000 microns. Linear lateral relative motion of plate 3 with respect to plate 2 is supplied by stepping motor 5 and linear translational device 6. The stepping motor and linear translational device provide accurate linear lateral oscillations which have a frequency greater than the Brownian motion of the colloidal suspension spheres, and an amplitude approximately equal to the gap between plates 2 and 3.

In one example a colloidal suspension of silica spheres in water of volume fraction 0.57 was contained in a gap of 100 microns between glass plates 2 and 3. Stepping motor 5 and translational device 6 are used to apply lateral oscillation to plate 3 at an amplitude of about 100 microns and a frequency of 1 Hz. After about 1000 cycles a crystalline layer is formed.

Figure 3:
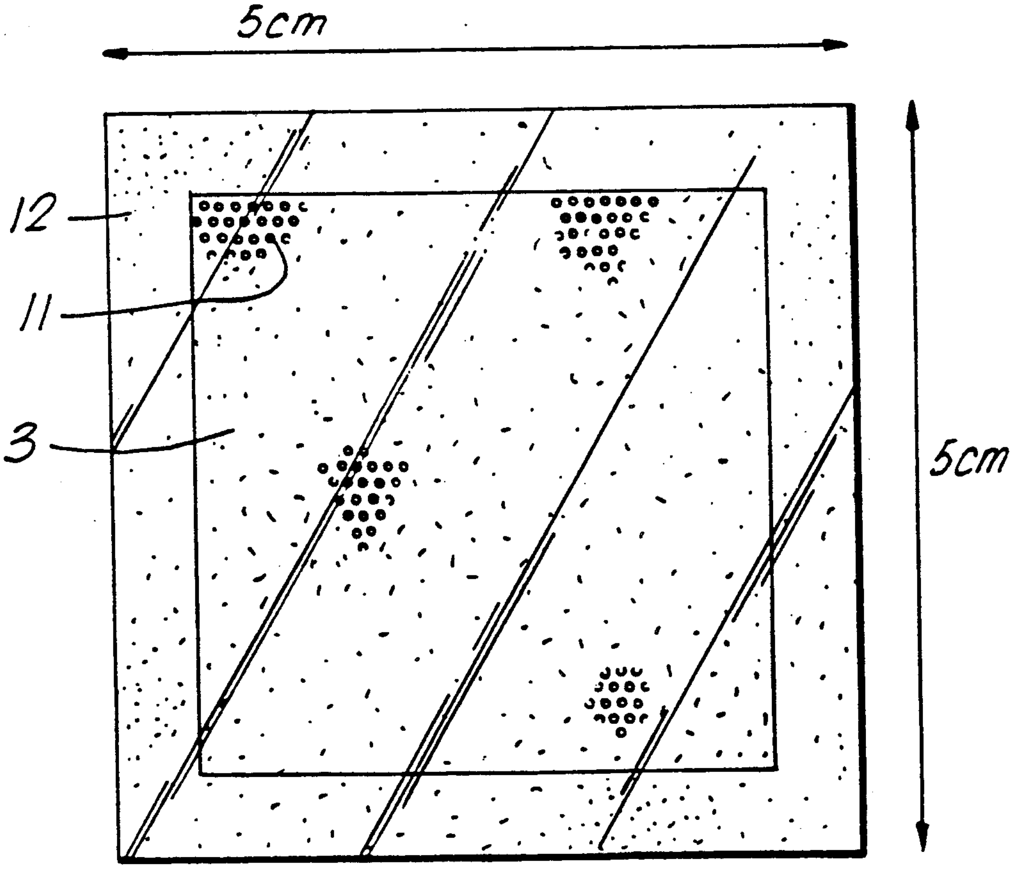
FIG. 3 is a schematic plan view of the notch optical filter described in FIG. 2.

The apparatus described above may be used to produce essentially perfect, oriented colloidal crystal material which then becomes an integral part of a notch optical filter as shown in FIGS. 2 and 3. Colloidal suspension 1 is a crystalline arrangement 11 of oriented, essentially perfect colloidal crystals due to alignment by precisely controlled relative motion as described by FIG. 1. In an alternative arrangement, either or both of plates 2 and 3 may be lens material with precise optical properties instead of float glass as described by FIG. 1. After forming a crystalline layer, an epoxy sealant 12 is used to seal the gap at the extreme edges of plates 2 and 3. As may be seen from the plan view in FIG. 3, the notch filter has plan dimensions of about 5 cm by 5 cm.

Cylindrical geometries may also be produced using the invention described. FIG. 4 describes an apparatus where colloidal suspension 21 is enclosed between cylindrical plate 22 of thickness about 1 mm and rod 23, which are concentric. Rod 23 is subjected to oscillating shear applied by stepping motor 24. There is a gap of about 50 microns to 1000 microns between cylindrical plate 22 and rod 23. Oscillation amplitude is arranged to be approximately equal to the gap width.

The apparatus described by FIGS. 1 and 4 may be used for producing high strength ceramic sheets and pipes where colloidal suspensions 1 and 21 are made up of materials such as charge-stabilized alumina in water at a volume fraction of about 0.6.

We claim:

1. A method of growing an oriented, essentially perfect, single colloidal crystal comprising the sequential steps of:

(i) preparing a well mixed suspension of monosized colloidal spheres with radii in the range of 0.1 microns and 1.0 microns having a volume fraction, $\phi$, greater than 0.49 in a suitable carrier liquid, (ii) inserting the colloidal suspension in a relatively narrow gap between two effectively parallel surfaces, and (iii) subjecting the two surfaces to relative oscillating motion parallel to their surfaces, the relative motion having a frequency greater than the Brownian motion of the colloidal spheres and an amplitude approximately equal to that of the gap between the two surfaces.

2. The method of claim 1 where the colloidal crystal has an oriented, essentially perfect, face centred cubic structure.

3. The method of claim 1 where the minimum volume fraction of colloidal spheres is 0.55.

4. The method of claim 1 where the relative motion is linear.

5. The method of claim 1 where the two surfaces are planar.

6. The method of claim 1 where the two surfaces are concentrically cylindrical.

7. The method of claim 1 and further comprising the subsequent step of sealing the resultant colloidal crystal between the two surfaces.

8. The method of claim 1 and further comprising the subsequent steps of evaporating at least some of the carrier liquid and sealing the colloidal crystal between two surfaces.

9. The method of claim 1 and further comprising the subsequent steps of using a gelling agent to react with the carrier liquid and form a gel matrix for the colloidal crystal and then sealing the gel matrix and crystal between the two surfaces.

10. The method of claim 1 where at least one of the surfaces is optically transparent.

11. The method of claim 1 wherein the suspension comprises charge-stabilized inorganic colloidal spheres in water.

12. The method of claim 11 where the charge-stabilized inorganic colloidal spheres are one of silica, titania, alumina or zirconia.

13. The method of claim 1 where the suspension comprises sterically-stabilized inorganic colloidal spheres in at least one organic carrier liquid.

14. The method of claim 13 where the sterically-stabilized inorganic colloidal spheres are one of silica, titania, alumina or zirconia.

15. The method of claim 13 where the organic carrier liquid is at least one of dodecane, decalin, tetralin, cyclohexane and carbon disulphide.

16. The method of claim 1 and further comprising the sequential steps of compressing the colloidal crystal and sintering.

17. The method of claim 1 where the refractive index of the colloidal spheres is close to, but not exactly equal, to the refractive index of the carrier liquid.

18. A colloidal crystal device comprising an oriented, essentially perfect colloidal crystal, made by a method in accordance with claim 1, in a carrier liquid where the colloidal crystal and carrier liquid are contained between two surfaces.

19. The device of claim 18 wherein at least one of the surfaces is optically transparent.

20. The device of claim 18 wherein the colloidal crystal is sealed between the two surfaces.

21. The device of claim 18 wherein at least some of the carrier liquid is evaporated off.

22. The device of claim 18 wherein the carrier liquid is formed into a gel matrix.

23. The device of claim 18 where the colloidal crystal comprises charge-stabilised polymer colloidal spheres and the carrier liquid is water.

24. The device of claim 23 where the charge-stabilised polymer colloidal spheres are polystyrene.

25. The device of claim 18 where the colloidal crystal comprises sterically-stabilised polymer spheres and the carrier liquid is at least one organic liquid.

26. The device of claim 25 where the sterically-stabilised polymer colloidal spheres are polymethylmethacrylate.

27. The device of claim 25 where the carrier liquid comprises at least one of the organic liquids dodecane, decalin, tetralin, cyclohexane and carbon disulphide.

28. The device of claim 18 forming a notch optical filter wherein the colloidal sphere radius and refractive index of the colloidal medium are selected to co-operated to reflect a specific wavelength and to transmit other wavelengths.

29. A colloidal crystal device comprising an oriented, essentially perfect crystalline array of inorganic colloidal spheres, made by a method in accordance with claim 1, forming a colloidal crystal ceramic.

30. The device of claim 29 where the inorganic colloidal spheres are one of silica, titania, alumina or zirconia.

* * * * *